United States Patent [19]

Kembo et al.

[11] Patent Number: 4,825,453
[45] Date of Patent: Apr. 25, 1989

[54] X-RAY EXPOSURE APPARATUS

[75] Inventors: Yukio Kembo; Yoshihiro Komeyama; Minoru Ikeda; Akira Inagaki, all of Yokohama, Japan

[73] Assignee: Hitachi, Ltd., Tokyo, Japan

[21] Appl. No.: 788,861

[22] Filed: Oct. 17, 1985

[30] Foreign Application Priority Data

Oct. 19, 1984 [JP] Japan ................. 59-218383

[51] Int. Cl.⁴ ............................... G21K 5/00
[52] U.S. Cl. ....................... 378/34; 141/66; 250/503.1; 250/432 R
[58] Field of Search ............... 378/34, 35; 250/432 R, 250/503.1, 288, 482.1; 141/7, 65, 66, 83

[56] References Cited

U.S. PATENT DOCUMENTS

| 2,307,754 | 1/1943 | Beckwith | 141/66 |
| 2,804,102 | 8/1957 | Cooksley et al. | 141/65 |
| 4,119,855 | 10/1978 | Bernacki | 378/34 |
| 4,403,336 | 9/1983 | Taniguchi et al. | 378/34 |
| 4,436,998 | 3/1984 | Tallon | 250/288 |
| 4,516,254 | 5/1985 | Komeyama et al. | 378/35 |
| 4,648,106 | 3/1987 | Novak | 378/34 |

FOREIGN PATENT DOCUMENTS 58-26825 6/1983 Japan .
0191433 11/1983 Japan ................. 378/34

OTHER PUBLICATIONS

Patent Abstracts of Japan vol. 7 No. 166 (E-188) [1311] Jul. 21, 1983 pertaining to JP-A-No. 58-73 116.
"High Speed Replication of Submicron Features . . ." by Maydan et al. Transactions on Electronic Devices vol. 22 #7 Jul. 1975.

Primary Examiner—Craig E. Church
Assistant Examiner—John C. Freeman
Attorney, Agent, or Firm—Antonelli, Terry & Wands

[57] ABSTRACT

Disclosed is an X-ray exposure apparatus having a low attenuation chamber supplied with a gas absorbing little X-rays, the low attenuation chamber being interposed between an X-ray source and a mask so that X-rays transmitted through the low attenuation chamber are irradiated on the mask so as to transfer a mask pattern onto a resist on a wafer, the apparatus comprising detecting means for detecting the gas or components mixed in the gas in the low attenuation chamber, control means for controlling a quantity of supply of the gas into the low attenuation chamber in accordance with an output signal of the detecting means, and/or adjusting means for adjusting a quantity of exposure of said X-rays irradiated on the mask in accordance with an output signal of the detecting means.

15 Claims, 2 Drawing Sheets

X-RAY EXPOSURE APPARATUS

BACKGROUND OF THE INVENTION

The present invention relates to an X-ray exposure apparatus used for manufacturing semiconductor integrated circuits, and particularly to an X-ray exposure apparatus suitable for controlling a supply of a low X-ray absorbing gas to be filled in a less-attenuation chamber interposed between an X-ray source and a mask.

If atmospheric air exists in an X-ray transmitting path between an X-ray source and a mask in an X-ray exposure apparatus, X-rays are disadvantageously absorbed in the atmospheric air, resulting in low transmittivity of the X-rays, under-exposure to the X-rays, lower through-put and less accuracy in alignment. Therefore, in the prior art, a less-attenuation chamber is provided between an X-ray source and a mask, and the inside of the chamber is made a vacuum or filled with a low X-ray absorbing gas, for example, He (helium), i.e. a gas having a small absorption coefficient for X-rays which absorption coefficient for X-rays is smaller than that of atmospheric air. As one of the prior art disclosed, "IEEE Transaction on Election Device", Vol. ED-22, No. 7, pages 429–433, (July, 1975) referred to in Japanese Patent Examined Publication No. 58-26825 (WO No. 79/00340, PCT/US78/00179) teaches the necessity of filling the less-attenuation chamber with He or a very low pressure of air.

In FIG. 1, X-rays 2 generated from an X-ray source 1 including an electron beam generator 1a and an X-ray target 1b are entered into a less-attenuation chamber 5 through a vacuum chamber 12 and a beryllium window 4, irradiated on a mask 9, and reach a resist on a wafer 11 through a gap 10 between the mask 9 and the wafer 11 so that, the shape of a pattern made of X-ray absorbing material on the mask 9 is transferred onto the resist. If the X-rays were largely absorbed before reaching the resist, under-exposure would be caused as described above. However, the X-ray transmittivity $K_x$ is defined by the following equation and variable depending on the absorption coefficiency $\mu$ of the material and the passing distance t through which the X-ray is transmitted.

$$K_x = \exp(-\mu t)$$

The value of $\mu$ is smaller as the atomic number of the material is smaller and the wavelength of the X-ray is shorter.

In the case where the wavelength of the X-rays 2 and the transmitting distance t are selected to be 5.4 Å and 30 cm respectively, the X-ray transmittivity $K_x$ is almost 100% in the vacuum chamber 12, 98% in the beryllium window 4, almost 100% in the gap 10, and 95% in the less-attenuation chamber 5 filled with 100% helium. Thus, it is found that the X-ray transmittivity $K_x$ is the lowest in the less-attenuation chamber 5. Accordingly, it becomes necessary to make the X-ray transmittivity $K_x$ in the low attenuation chamber 5 as high as possible and to maintain the highest transmittivity $K_x$ stably.

In the prior art, as described above, a helium gas or the like is filled in the less-attenuation chamber 5 to prevent the X-ray transmittivity from lowering. In any case, however, no prior art is found which suggests to pay attention on stable maintenance of the X-ray transmittivity $K_x$ and teaches a specific technique for achieving such stable maintenance. In the prior art, therefore, there has been a disadvantage that it is difficult to judge whether a He gas is sufficiently substituted for atmospheric air in the less-attenuation chamber 5, whether a predetermined percentage of He gas is supplied, whether there is leakage of the He gas, or the like. Further, because He gas is expensive, it is economically undesired to supply extra He gas on the assumption that there occurs leakage of helium.

SUMMARY OF THE INVENTION

An object of the present invention is to provide an X-ray exposure apparatus in which the quantity of a low X-ray absorbing gas filled in a less-attenuation chamber interposed between an X-ray source and a mask, is controlled so as to hold it to an optimum state thereby preventing under-exposure of the X-rays.

In order to achieve the above-mentioned object, the X-ray exposure apparatus according to the present invention is arranged such that there are provided detecting means for detecting an amount of a low X-ray absorbing gas filled in a less-attenuation chamber or an amount of a remaining mixed gas other than the first-mentioned gas, and control means for controlling the quantity of supply of the first-mentioned gas in accordance with an output signal of the detecting means, whereby the quantity of the first-mentioned gas filled in the chamber is determined from the output of the detecting means to thereby maintain the filled quantity of the first-mentioned gas at a predetermined value.

DESCRIPTION OF THE PREFERRED EMBODIMENTS

Figure 1:
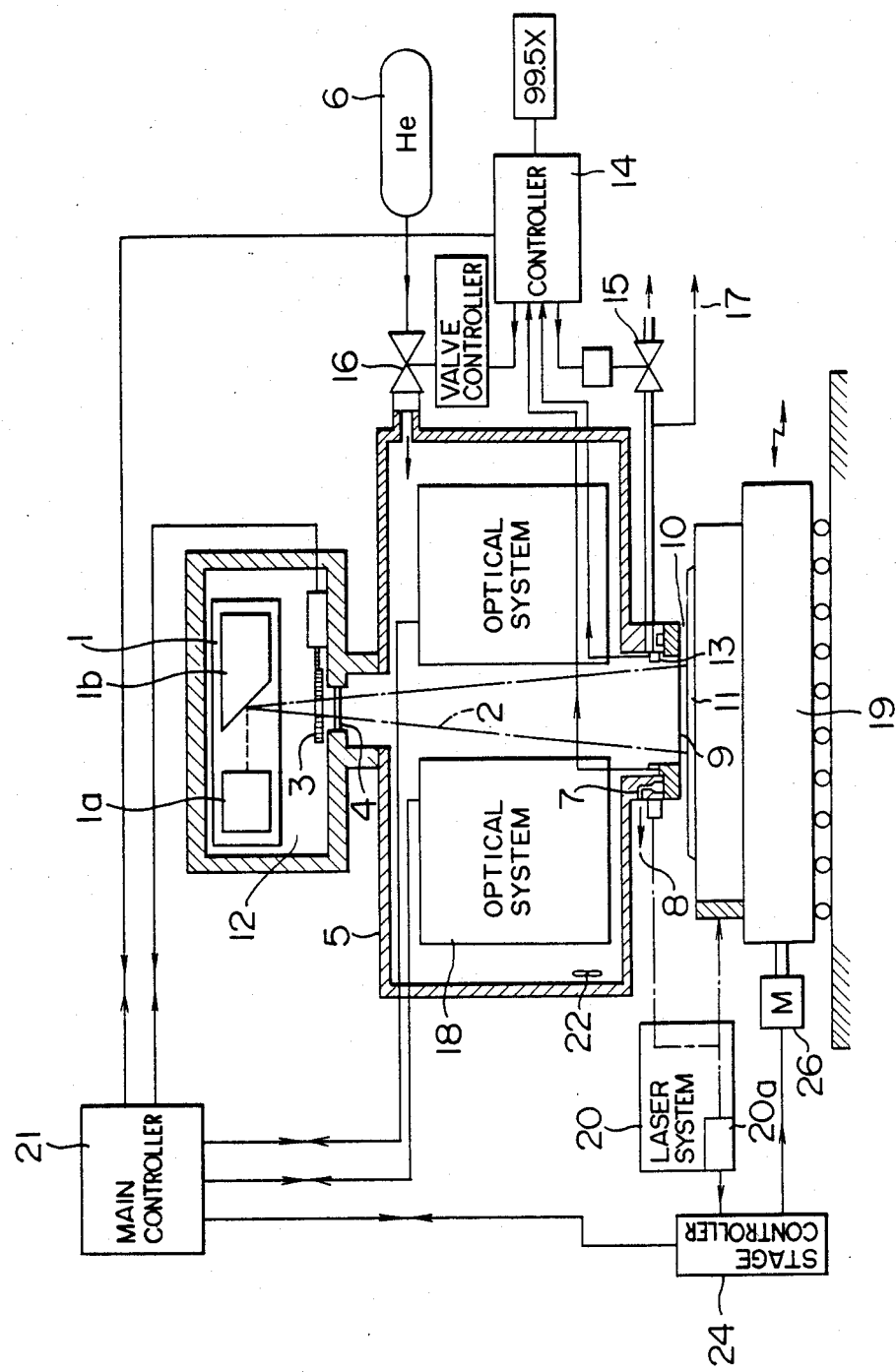
FIG. 1 is a diagram showing the structure of an embodiment of the X-ray exposure apparatus according to the present invention.

Referring to the drawings, preferred embodiments of the present invention will be described hereunder.

First, the outline of an embodiment of the present invention will be described.

In FIG. 1, X-rays 2 generated from an X-ray source 1 housed in a vacuum chamber 12 enter a less-attenuation chamber 5 through a shutter 3, which is opened during an exposure period, and a beryllium window 4. In the less-attenuation chamber 5, the X-rays 2 pass through a low X-ray absorbing gas (a He gas in the this embodiment) filled in the chamber 5 in place of atmospheric air, irradiate a mask 9 supported by a mask chuck 7 by vacuum attraction 8, transmit through the mask 7, and reach a resist on a wafer 11 through a gap 10 between the mask 9 and the wafer 11 to thereby transfer a pattern of the mask 9 onto the resist on the wafer 11. The wafer 11 is mounted on a stage 19 whose position is adjusted for the alignment of the wafer 11 with the mask 9 by a laser distance-measuring system 20 and an optical system 18. The laser distance-measuring system 20 divides the laser beam to transmit along two optical paths, so as to project the two laser beams toward the stage 19 and the mask chuck 7 respectively, detects the position of the stage relative to the mask by the interference between the laser beams reflected from the stage and the mask, respectively, thereby supplying an output signal to a stage controller 24 which in turn drives an electric motor 26 in accordance with the output signal to adjust roughly the position of the stage. The optical system 18 detects offset in alignment between the mask and the wafer in a known manner and produces an output signal which is in turn applied to the stage controller 24 through a main controller 21 so as to drive the motor 20 to perform fine adjustment of the position of the stage.

A sensor 13 such as an oxygen sensor, which acts as a detecting means is provided in the vicinity of the mask chuck 7 in the less-attenuation chamber 5 so as to detect the quantity of oxygen (%) mixed in the He gas in the less-attenuation chamber 5. A control means is provided to control the supply of He gas into the chamber 5. The means includes a controller 14 connected to the oxygen sensor 13, an exhaust valve 15 the opening/closing of which is controlled by the controller 14, and a He gas supply valve 16 which is communicated with a He gas supply source 6.

In the above-mentioned structure, the quantity of He (%) in the less-attenuation chamber 5 is determined from the detected quantity of oxygen (%) and controlled to be held at an optimum value by the controller 14.

This embodiment will be further described in detail hereunder.

Although it is desirable to hold the inside of the less-attenuation chamber 5 substantially at a vacuum in a view-point of raising the X-ray transmittivity $K_x$, there are problems in tight sealing of the less-attenuation chamber 5 as well as in strength of the mask 9. Therefore, generally, it is practical to reduce the degree of vacuum in the less-attenuation chamber 5 or to fill therein a He gas which has a small absorption coefficient for X-rays so as to absorb less X-rays. The atmospheric air initially existing in the less-attenuation chamber 5 is substituted by the He gas. The X-ray transmittivity $K_x$ is variable depending on the quantity of the He gas and the quantity of the components of the atmospheric air, for example, oxygen, mixed with the He gas after the He gas has been filled, and expressed in the following equation:

$$K_x = \exp\left[-\left(\mu_{He} \cdot t \cdot \frac{X}{100} + \mu_O \cdot t \cdot \frac{1}{5}\left(1 - \frac{X}{100}\right) + \mu_N \cdot t \cdot \frac{4}{5}\left(1 - \frac{X}{100}\right)\right)\right]$$

where, X represents the quantity of the He gas (%), $\mu_{He}$, $\mu_O$, and $\mu_N$ represent the respective absorption coefficients of helium (He), oxygen, (O), and nitrogen (N), and t represents a transmitting distance.

Table 1 shows the relationship between the composition of the mixed gas including the helium and, the oxygen the X-ray transmittivity $K_x$ (%), and Table 2 shows the relationship between the degee of vacuum (Torr) in the less-attenuation chamber 5 and the X-ray transmittivity $K_x$ (%).

TABLE 1

| Quantity of He X (%) | 90 | 95 | 98 | 99 | 99.5 | 99.8 | 100 |
|---|---|---|---|---|---|---|---|
| Quantity of Oxygen (%) | 2 | 1 | 0.4 | 0.2 | 0.1 | 0.04 | 0 |
| X-ray Transmittivity $K_x$ (%) | 30 | 54 | 75 | 85 | 90 | 93 | 95 |

TABLE 2

| Degree of vacuum (Torr) | $5 \times 10^{-2}$ | $1 \times 10^{-2}$ | $5 \times 10^{-3}$ | $2 \times 10^{-3}$ | $1 \times 10^{-3}$ |
|---|---|---|---|---|---|
| X-ray Transmittivity $K_x$ (%) | 56 | 89 | 94 | 98 | 99 |

In the above-mentioned prior art, it is explained that the degree of vacuum in the less-attenuation chamber 5 is desirable to be under $1 \times 10^{-2}$ Torr. In the Table 2, if the degree of vacuum is $1 \times 10^{-2}$ Torr, the X-ray transmittivity $K_x$ becomes 89%. In order to keep the X-ray transmittivity $K_x$ at 89%, the quantity of helium X and the quantity of the oxygen should be about 99.5% and 0.1%, respectively. When helium is substituted for atmospheric air to be filled in the less-attenuation chamber 5, if the quantity of residual oxygen is detected to be 0.1%, it is judged that the less-attenuation chamber 5 is filled with helium of 99.5% and the X-ray transmittivity $K_x$ is kept to be 89%.

In this embodiment based on the above-mentioned principle, an oxygen sensor 13 is used for detecting the quantity of the residual oxygen. Although the oxygen sensor 13 is provided in the vicinity of the mask chuck 7 as shown in FIG. 1, it will be understood that the oxygen sensor 13 may be provided at any position in the less attenuation chamber 5 at which the filled gas, that is helium, is considered to be most thin. One of the positions satisfying the above-mentioned conditions is in the vicinity of the mask chuck 7 where the helium may be leaked some degree by vacuum 8. Of source, however, the position of the sensor is not limited to this.

The shutter 3, the controller 14, the optical system 18, and the laser system 20 are connected and controlled by the main controller 21. A fan 22 is provided for uniformly distributing the helium gas in the less-attenuation chamber 5. In order to discharge only the drain of helium when the exhaust valve 15 is closed, a drain pipe 17 is provided in a duct line connecting the exhaust valve 15 to the less-attenuation chamber 5.

Next, operations of the embodiment will be described.

Initially, atmospheric air exists in the less-attenuation chamber 5. In the first place, the atmospheric air is substituted by a helium gas. That is, the opening of the mask chuck 7 is closed by the mask 9, a shutter (not shown), or a dummy mask (not shown), and the exhaust valve 15 is opened in accordance with the instruction of the controller 14. At the same time, the helium supply valve 16 is opened in accordance with the instructions of the controller 14, so that a helium gas is introduced from the helium supply source 6. The quantity of residual oxygen is detected by the oxygen sensor 13. When the quantity of the oxygen is reduced to 0.1%, the controller 14 instructs to close the helium supply valve 16 and the exhaust valve 15.

Thus, the substitution of the atmospheric air by helium is completed. Thereafter, the oxygen sensor 13 continuously operates to detect the quantity of the oxygen and the controller 14 operates to supplement helium in accordance with a chamber in quantity of the oxygen.

Although the oxygen sensor is used as a means for detecting a component of the atmospheric air in this embodiment, the sensor is not limited to such an oxygen sensor, according to the invention, but a nitrogen sensor, or a combination of both the oxygen and nitrogen sensors may be employed. When an X-ray absorbing gas other than atmospheric air is initially filled and substituted by a low X-ray absorbing gas having an absorption coefficient for X-rays which is smaller than that of atmospheric air, a sensor for such an X-ray absorbing gas may be employed. Although the quantity of oxygen is selected 0.1% in the embodiment, it is, of course, unnecessary to be limited to this value. The oxygen sensor 13 may be a simple one for producing an output signal when the quantity of the oxygen exceeds a predetermined constant value. It is possible to adjust the amount of X-ray exposure by adjusting the opening or closing time of the shutter 3 by the main controller 21 when the oxygen sensor 13 indicates that the quantity of oxygen is deviated from 0.1%.

Figure 2:
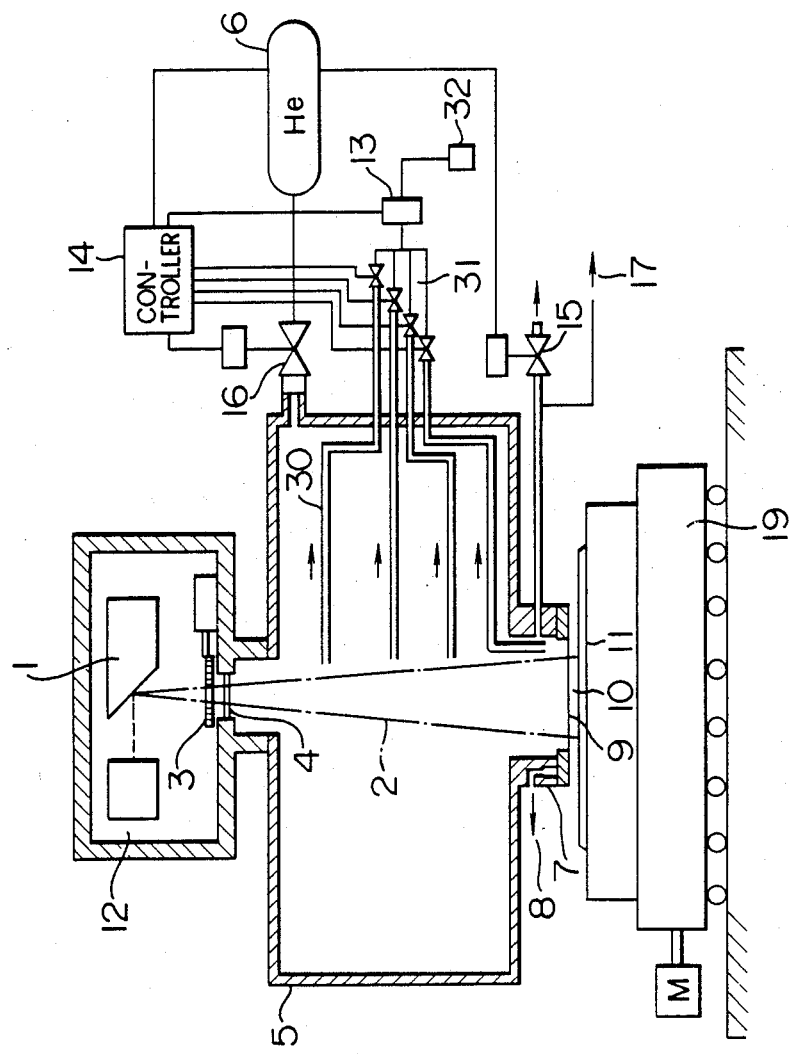
FIG. 2 is a diagram showing the structure of another embodiment of the X-ray exposure apparatus acording to the present invention.

FIG. 2 is a diagram showing another embodiment of the X-ray exposure apparatus according to the present invention, in which the same reference numerals as those in FIG. 1 designate the same or like components.

In this embodiment, a sensor 13 such as an oxygen sensor is provided outside the less-attenuation chamber 5. A plurality of pipes 30 with their respective ends inserted into the less attenuation chamber 5 at selected positions are connected at their other ends of the oxygen sensor 13. Valves 31 are interposed in the pipes 30 respectively, and oxygen in the less-attenuation chamber 5 is introduced by a vacuum pump 32 up to the oxygen sensor 13 to be detected there. In this embodiment, the quantity of oxygen is detected for various portions within the less-attenuation chamber 5, so that there are such advantages that the quantity of oxygen is detected and controlled more accurately than the first embodiment and the maintenance such as calibration or the like for the oxygen sensor 13 can be easily performed. However, the former embodiment is superior to this embodiment in that the inside of the less-attenuation chamber 5 is not disturbed in the former. The sensor 13 indicated as an oxygen sensor in FIGS. 1 and 2 is replaced by a mass-analyzer, such as a mass spectrometer, enabling direct measurement of the relative quantity or ratio of helium gas. Alternatively, the density of gas may be measured by measuring the reflective index of light. In a further modification, a separate gas container having a known weight is provided separately from the less-attenuation chamber 5 and interconnected through a flexible pipe to the chamber so that the gas filled in the chamber 5 is introduced into the container and the gas density is determined by measuring a weight of the container including the introduced gas and calculating a net weight of the introduced gas.

As described above, the present invention have advantages in the points as follows:

(2) X-ray exposure is stable and yield in products is improved;

(2) The completely tight seal is unnecessary, and it is also unnecessary to reduce the inside atmospheric air of the less-attenuation chamber to a substantially complete vacuum pressure before substituting a low X-ray absorbing gas for the atmospheric air, which is required in the prior art apparatus, so that the apparatus is reduced in cost and the structure is made compact in size;

(3) The X-ray transmittivity can be easily controlled;

(4) Gas leakage from the less-attenuation chamber can be immediately detected and dealt with at once.

(5) In the case where helium is used as a low absorbing gas filled in the less attenuation chamber, it has been proved that 15% of helium can be saved.

We claim:

1. An X-ray exposure apparatus having a less-attenuation chamber supplied with a low X-ray absorbing gas having an absorption coefficient for X-rays smaller than that of atmospheric air, said less-attenuation chamber being interposed between an X-ray source and a mask so that X-rays transmitted through said less-attenuation chamber are irradiated on said mask so as to transfer a pattern of the mask onto a resist on a wafer, said apparatus comprising detecting means for detecting the density of said gas or a component mixed in said gas in said less-attenuation chamber, and control means for controlling a quantity of supply of said gas into said less-attenuation chamber in accordance with an output signal of said detecting means so as to control the transmissivity of the X-rays through said less-attenuation chamber to be at least a predetermined value and enable proper exposure with the X-rays.

2. An X-ray exposure apparatus according to claim 1, in which said detecting means includes at least one sensor for detecting a quantity of a selected one of oxygen and nitrogen.

3. An X-ray exposure apparatus according to claim 1, in which said detecting means includes means for analyzing the mass of said gas.

4. An X-ray exposure apparatus having a less-attenuation chamber supplied with a low X-ray absorbing gas having an absorption coefficient for X-rays smaller than that of atmospheric air, said less-attenuation chamber being interposed between an X-ray source and a mask so that X-rays transmitted through said less-attenuation chamber are irradiated on said mask so as to transfer a pattern of the mask onto a resist on a wafer, said apparatus comprising detecting means for detecting the density of said gas or a component mixed in said gas in said less-attenuation chamber, control means for controlling a quantity of supply of said gas into said less-attenuation chamber in accordance with an output signal of said detecting means, and adjusting means for adjusting a quantity of said X-rays effectively irradiated on said mask in accordance with an output signal of said detecting means.

5. An X-ray exposure apparatus according to claim 4, in which said adjusting means is arranged to control an opening/closing timing of an X-ray shutter provided in a path of the X-rays to be irradiated on said mask.

6. An X-ray exposure apparatus according to claim 1, further comprising means disposed in said less-attenuation chamber for equalizing a distribution of said gas by causing flow of said gas in said attenuation chamber.

7. An X-ray exposure apparatus having a less-attenuation chamber supplied with a low X-ray absorbing gas having an absorption coefficient for X-rays smaller than that of atmospheric air, said less-attenuation chamber being interposed between an X-ray source and a mask so that X-rays transmitted through said less-attenuation chamber are irradiated on said mask so as to transfer a pattern of the mask onto a resist on a wafer, said apparatus comprising detecting means for detecting the density of said gas or a component mixed in said gas in said less-attenuation chamber, and adjusting means for adjusting a quantity of X-rays effectively irradiating onto said mask in accordance with an output signal of said detecting means.

8. An X-ray exposure apparatus according to claim 7, in which said adjusting means is arranged to control an opening/closing timing of an X-ray shutter provided in a path of the X-rays to be irradiated on said mask.

9. An X-ray exposure apparatus according to claim 7, further comprising means disposed in said less-attenuation chamber for equalizing a distribution of said gas by causing flow of said gas in said attenuation chamber.

10. An X-ray exposure apparatus for exposing a wafer to X-rays from an X-ray source through a mask, said apparatus comprising:
- a less-attenuation chamber provided between said X-ray source and said mask so that the X-rays from said X-ray source pass through said chamber and said mask for projection onto the wafer;
- supply means connected to an upper portion of said chamber for supplying into said chamber a controlled quantity of a selected gas having an absorption coefficient for X-rays smaller than that of atmospheric air;
- discharge means connected to a lower portion of said chamber for enabling air existing in said chamber and which may contain a small amount of the selected gas to discharge therethrough outside of said chamber;
- detecting means for detecting the density of said selected gas in said chamber; and
- control means for controlling the quantity of said selected gas supplied through said supply means in accordance with the detected value of the density, said control means controlling the quantity of said selected gas supplied through said supply means so as to control the transmittivity of the X-rays through said chamber to be at least a predetermined value.

11. An X-ray exposure apparatus according to claim 10, further comprising means disposed in said chamber for equalizing a distribution of said selected gas by causing flow of said selected gas in said chamber.

12. An X-ray exposure apparatus according to claim 10, wherein said detecting means detects the density of a selected one of oxygen and nitrogen existing in said chamber.

13. An X-ray exposure apparatus according to claim 10, wherein said disccharge means includes an exhaust valve, said control means controlling the opening and closing of said exhaust valve, and a drain pipe for discharging a drain of said selected gas contained in air in said chamber.

14. An X-ray exposure apparatus for exposing a wafer to X-rays from an X-ray source through a mask, said apparatus comprising:
- a less attenuation chamber provided between said X-ray source and said mask so that the X-rays from said X-ray source pass through said chamber and said mask for projecting onto the wafer;
- supply means connected to an upper portion of said chamber for supplying into said chamber a controlled quantity of a selected gas having an absorption coefficient for X-rays smaller than that of atmospheric air;
- discharge means connected to a lower portion of said chamber for enabling air existing in said chamber and which may contain a small amount of the selected gas to discharge therethrough outside of said chamber;
- detecting means for detecting the density of said selected gas in said chamber; and
- control means for controlling the quantity of said selected gas supplied through said supply means in accordance with the detected value of the density;
- wherein said discharge means includes an exhaust valve, said control means controlling the opening and closing of said exhaust valve, and a drain pipe for discharging a drain of said selected gas contained in air in said chamber.

15. An X-ray exposure apparatus according to claim 13 wherein said detecting means detects the density of a selected one of oxygen and nitrogen existing in said chamber.

* * * * *